United States Patent
Kato et al.

(10) Patent No.: US 7,420,844 B2
(45) Date of Patent: Sep. 2, 2008

(54) NON-VOLATILE SEMICONDUCTOR MEMORY DEVICE

(75) Inventors: Junichi Kato, Kyoto (JP); Akira Sugimoto, Osaka (JP); Masayoshi Nakayama, Shiga (JP); Norio Hattori, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 37 days.

(21) Appl. No.: 11/523,564

(22) Filed: Sep. 20, 2006

(65) Prior Publication Data

US 2007/0064490 A1    Mar. 22, 2007

(30) Foreign Application Priority Data

Sep. 20, 2005    (JP) .............................. 2005-271769

(51) Int. Cl.
*G11C 16/06* (2006.01)
(52) U.S. Cl. ............................ 365/185.21; 365/185.03; 365/185.2; 365/185.22
(58) Field of Classification Search ............ 365/185.21, 365/185.2, 185.24, 185.03, 189.07, 210, 365/185.22
See application file for complete search history.

(56) References Cited

U.S. PATENT DOCUMENTS

| 6,411,549 | B1 |   | 6/2002  | Pathak et al. |              |
|-----------|----|---|---------|---------------|--------------|
| 6,480,418 | B2 |   | 11/2002 | Tanaka et al. |              |
| 6,650,568 | B2 | * | 11/2003 | Iijima        | ... 365/185.18 |
| 6,807,101 | B2 | * | 10/2004 | Ooishi et al. | ... 365/185.21 |

FOREIGN PATENT DOCUMENTS

JP          6-268180          9/1994

* cited by examiner

*Primary Examiner*—David Lam
(74) *Attorney, Agent, or Firm*—McDermott Will & Emery LLP

(57) ABSTRACT

A memory cell array with a group of memory cells capable of retaining two-bit information. Each memory cell has a pair of transistors having charge storage regions, mutually connected gates, and mutually connected sources. Word lines are provided to the gates of the transistors. Bit lines are provided to the sources and drains of the transistors. A pair of the bit lines respectively connected to the drains of a pair of transistors included in a memory cell are connected to a comparison input terminal of the differential detector. An information retained in the memory cell is read based on a comparison result of current amounts inputted to the differential detector via the pair of bit lines obtained by the differential detector in a state where memory cell currents are simultaneously and independently supplied to the pair of transistors.

11 Claims, 7 Drawing Sheets

F I G. 1
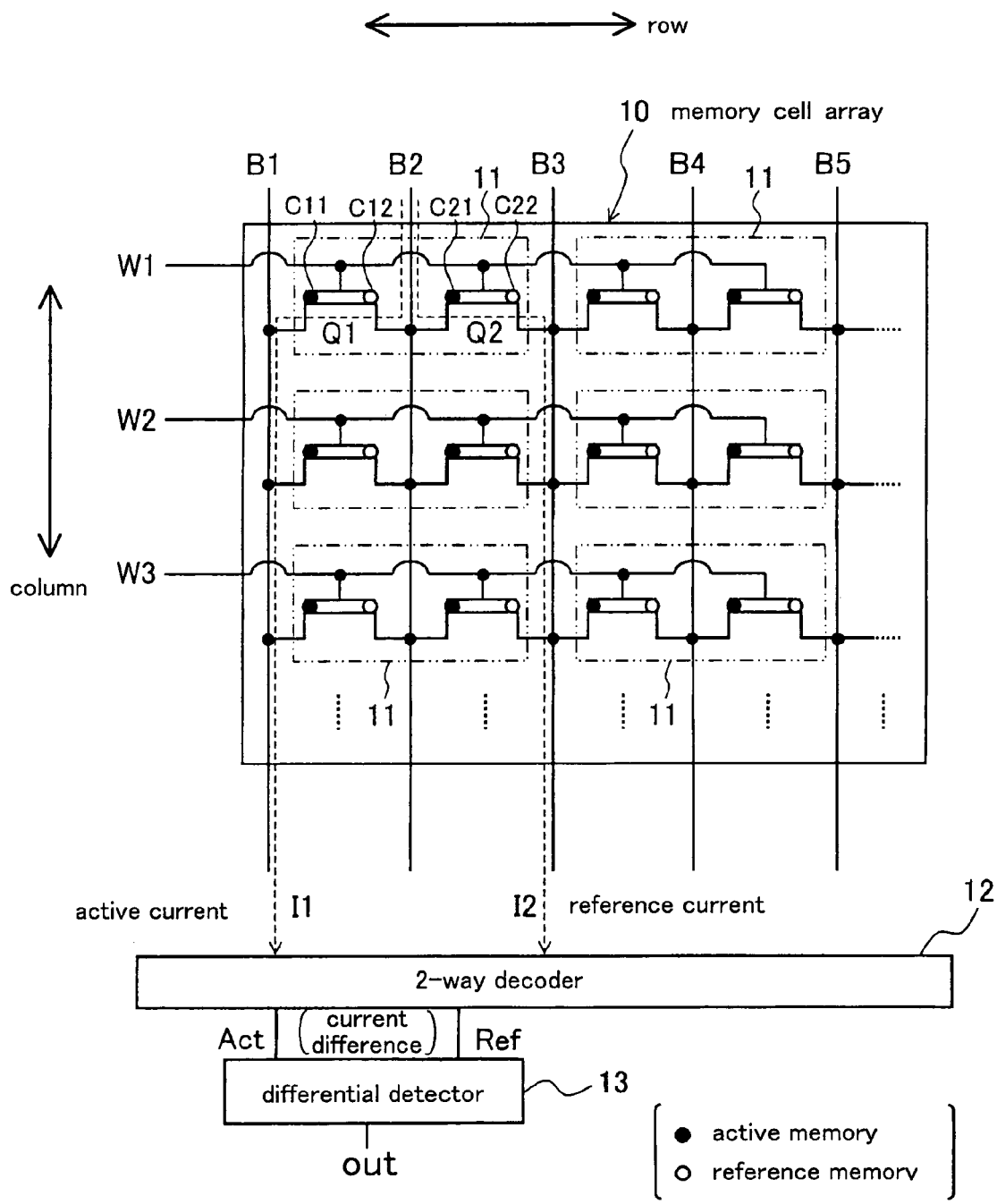

F I G. 2

| B1 | B2 | B3 | B4 | B5 |
|----|------|----|----|----|
| 0V | 1.2V | 0V | 0V | 0V |

| W1 | 4V |
|----|----|
| W2 | 0V |
| W3 | 0V |

F I G. 5
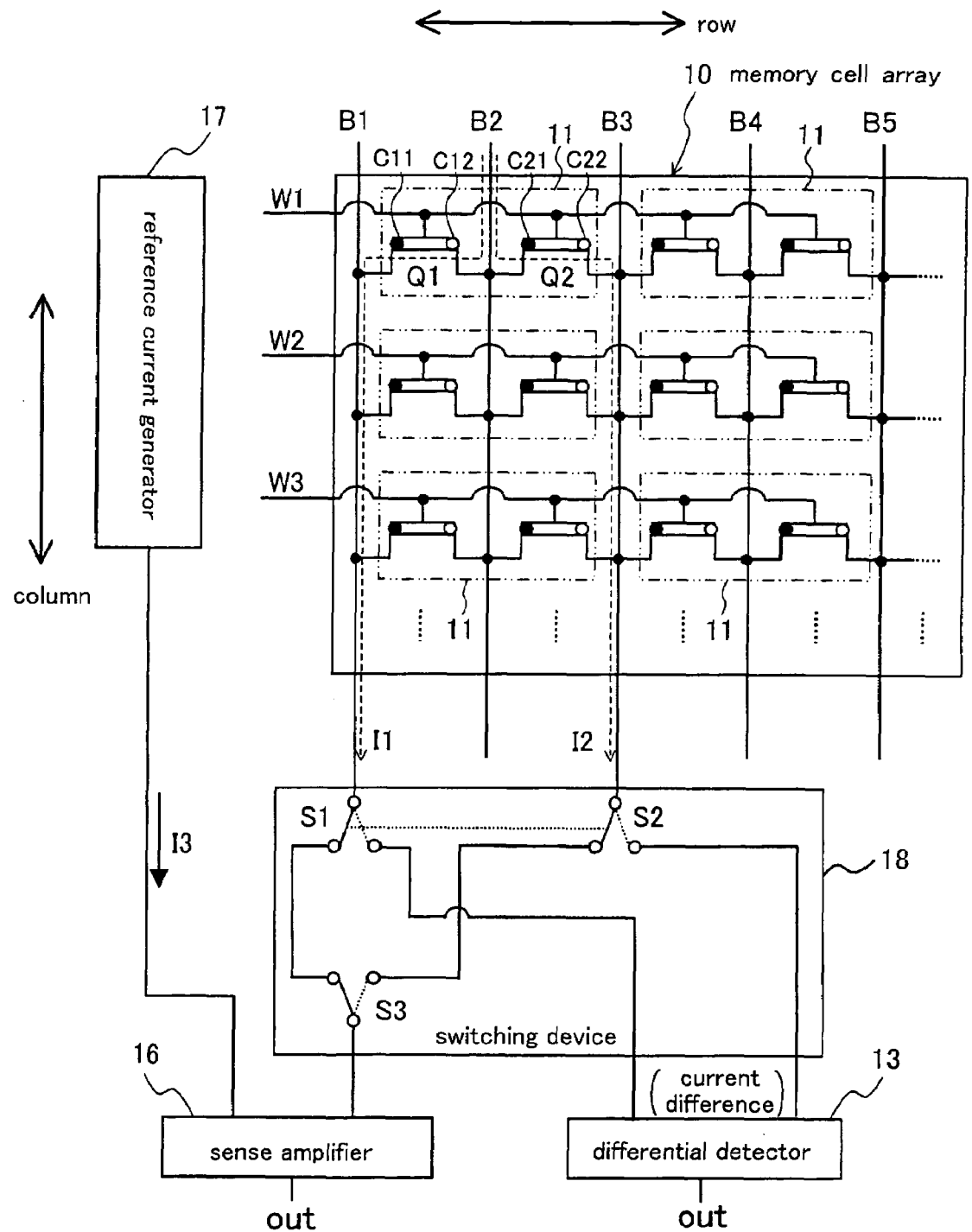

F I G. 6
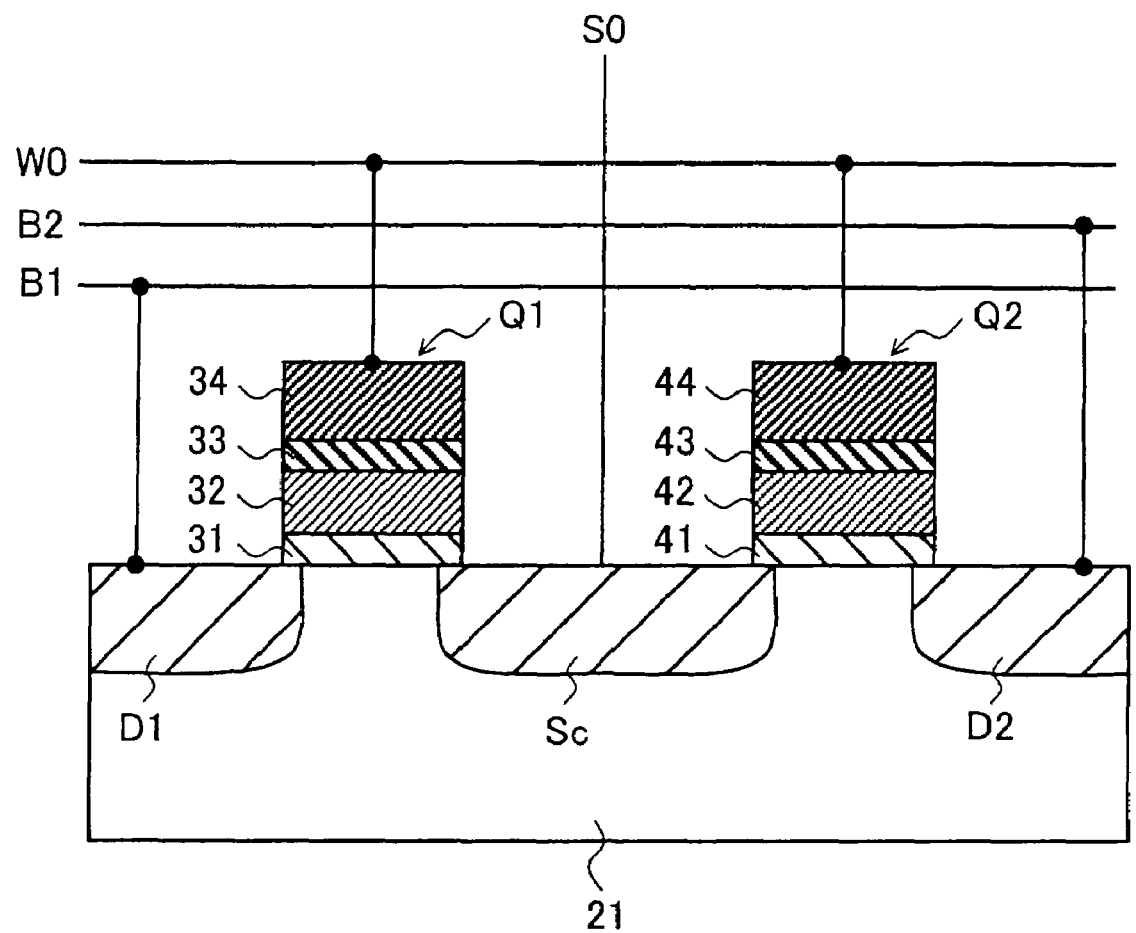

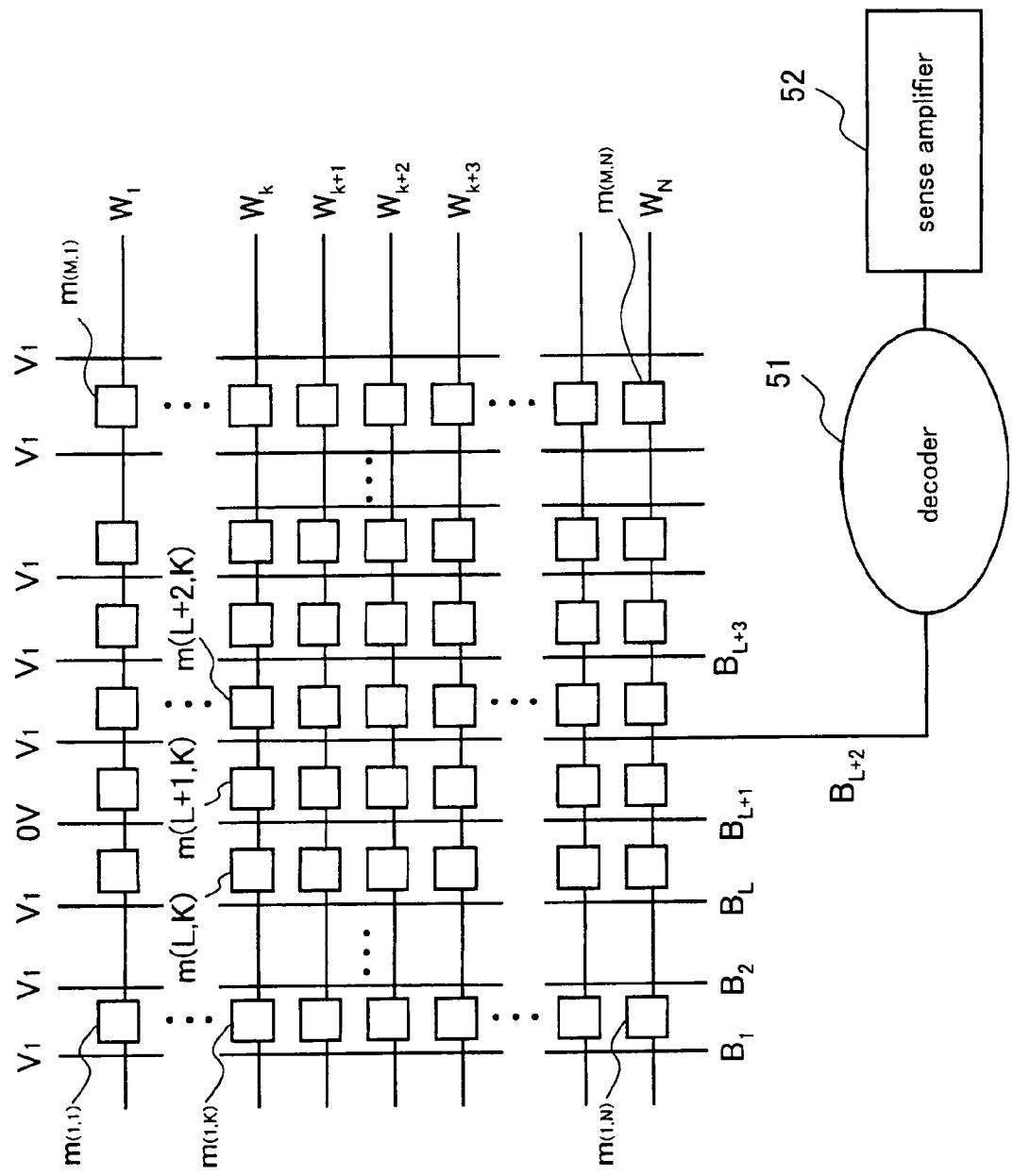

NON-VOLATILE SEMICONDUCTOR MEMORY DEVICE

BACKGROUND OF THE INVENTION

1. Field of the Invention

The present invention relates to a non-volatile semiconductor memory device installed in a system LSI, more particularly to a technology for increasing an integration level in a memory cell array and alleviating restrictions on a rewriting operation.

2. Description of the Related Art

There is a memory cell array having an virtual ground array structure as conventional technology, which includes two structures according to a sense amplifier method and a two-transistor current differential detecting method.

Sense Amplifier Method

FIG. 7 shows a schematic structure of the conventional memory cell array according to the sense amplifier method. The memory cell array having the virtual ground array structure comprises a plurality of memory cells m, a plurality of word lines W and a plurality of bit lines B. The memory cells m are arranged in a matrix shape. Each of the memory cells m is denoted by indices (x,y) showing their positions in the matrix. Each of rows of the memory cells are integrally connected to the word lines W. For example, all of the memory cells in a first line from the memory cell $m_{(1,1)}$ to the memory cell $m_{(1,N)}$ are connected to the word line $W_1$. Each column of the memory cells is connected to two bit lines comprising one of each on both sides of the column. For example, one sides (left) of all of the memory cells on the left column from the memory cell $m_{(1,1)}$ to the memory cell $m_{(1,N)}$ are connected to the bit line $B_1$, while the other sides (right) thereof are connected to the bit line $B_2$. The memory cell $m_{(x,y)}$ is thus connected to the word line $W_y$, bit lines $B_x$ and $B_{x+1}$.

Therefore, a tapping process executed to the selected word line and the selected two bit lines adjacent to each other enables various processes to be executed to the memory cell connected to them. First, a source line and a drain bit line are connected to a voltage source for supplying a predetermined voltage level which is $V_1$ ($V_1>0$, approximately 1.5 volts in general), and thereby pre-charged to the predetermined voltage level $V_1$. The voltage level $V_1$ is selected in accordance with a plurality of parameters such as a characteristic of the memory cell and word-line voltage. The voltage level $V_1$ is generally within the range of 1-2 volts.

In a reading operation, the source bit line is discharged to a ground potential, and the drain bit line is separated from the $V_1$ voltage source and connected to a sense amplifier 52 via a decoder 51. The voltage level detected on the drain bit line is used for determining data contents of the read memory cell. The decoder 51 includes all of electronic units allocated between the selected memory cell and the sense amplifier 52.

Two-Transistor Current differential Detecting Method

Referring to FIG. 6, a constitution of a non-volatile semiconductor memory device recited in No. H06-268180 of the Japanese Patent Applications Laid-Open in which the two-transistor current differential detecting method is adopted is described. A drain D1, a source Sc and a drain D2 are arranged with intervals on a surface of a semiconductor substrate 21. Floating gates 32 and 42 are formed at upper parts of a region on the surface of the semiconductor substrate 21 between the source Sc and the drains D1 and D2 via tunnel oxide films 31 and 41. Gate oxide films 33 and 43 are further formed thereon, and control gates 34 and 44 are further formed thereon. A source line S0 is connected to the source Sc, and a word line W0 is connected to the control gates 34 and 44. A bit line B1 and a bit line B2 complementary to the bit line B1 (hereinafter, referred to as complementary bit line) are respectively connected to the drains D1 and D2. The bit line B1 and the bit line B2 complemented with the bit line B1 are connected to a differential amplifier (not shown) in the reading operation.

The source Sc, drain D1, floating gate 32, control gate 34 constitute an MOS transistor Q1, and the source Sc, drain D2, floating gate 42, control gate 44 constitute an MOS transistor Q2.

Next, an operation of the non-volatile semiconductor memory device is described.

When data "1" is written, for example, a power-supply voltage (for example, 5V) is applied to the bit line B1, and the ground potential is applied to the complementary bit line B2. Further a high voltage (for example, 12V) is applied to, word line W0, and the ground voltage is applied to the source line S0. Accordingly, hot electrons are generated in vicinity of the drain D1 and injected into the floating gate 32. At the time, the hot electrons are not injected into the floating gate 42 because the hot electrons are not generated in vicinity of the drain D2. The complementary data whose logic levels are inverted relative to each other are thus memorized in the transistors Q1 and Q2, and it becomes a state where the data "1" is written in the memory cell.

Adversely, in the case of writing "0" data, the voltages applied to the bit line B1 and the complementary bit line B2 are set to the ones contrary to the before-mentioned voltages. Then, the electrons are injected into the floating gate 42, while the electrons are not injected into the floating gate 32. As a result, the data "0" is written in the memory cell.

Next, assuming that it is in a state where the data "1" is written wherein the electrons are injected into the floating gate 32 and not injected into the floating gate 42, the reading operation at this time is described.

In the reading operation, the power-supply voltage (for example, 5V) is applied to the word line W0, a low voltage (2V) is applied to the bit line B1 and the complementary bit line B2, and the ground potential is applied to the source Sc. The foregoing bias puts the transistor Q1 in an OFF state, and there is no memory cell current flow between the source Sc and the drain D1. However, the transistor Q2 is in an ON state, and the memory cell current flows into between the source Sc and the drain D2.

On the contrary, the transistor Q1 is in the ON state, and the Q transistor Q2 is in the OFF state in the reading operation in writing the data "0". The voltage drop in the bit line B1 or the complementary bit line B2 resulting from the memory cell current in the reading operation is detected by the differential amplifier connected to the bit line B1 and the complementary bit line B2 and thereby judged.

In order to erase the data, a high voltage (for example, 12V) is applied to the source line S0 and the ground voltage is applied to the word line W0. In this manner, the electrons that have been injected into the floating gates 32 and 42 are drawn into the drains D1 and D2 through a tunnel effect.

As described above, in the non-volatile semiconductor memory device according to the two-transistor current differential detecting method, the complementary data is memorized in the two transistors, and the data "1" or the data "0" is detected by carrying out the differential detection between the outputs of the two transistors when the data is read. Therefore, a larger potential difference in the signals supplied to the differential amplifier can be obtained in comparison to the non-volatile semiconductor memory device according to the sense amplifier method.

In the semiconductor memory device according to the sense amplifier method for reading the information based on the memory cell current, a constant current source or a constant voltage source (reference) previously set and the memory cell current are compared to each other. Therefore, it is necessary to clarify magnitude relation between the reference of the constant current or the constant voltage and a gate threshold voltage in order to set the gate threshold voltage of the memory cell. However, a characteristic of respective memory cell transistor in the memory cell array has a variation, which makes it difficult to control the gate threshold voltage to be constant. Therefore, a certain degree of variation width (margin) is conventionally allowed.

Due to the foregoing reason, it has to be enjoined with variations of all of the bits in order to set the margin of the variation amount of the gate threshold voltage necessary for the writing operation. However, it gives more influence on a time length of the writing operation as the variation amount of the gate threshold voltage necessary for the writing operation is larger. Further, in the case where wiring capacitances in a wiring from the memory cell transistor to the sense amplifier and a wiring from the constant current or constant voltage reference source to the sense amplifier are different, amount of the difference affecting the memory cell current has to be added to the margin.

In the non-volatile semiconductor memory device according to the two-transistor current differential detecting method, there is no restriction on the gate threshold voltage due to the variations of the memory cell transistors because the differential detection between the outputs of the two transistors is carried out. However, it requires two transistors in order to memorize one bit, an area efficiency of the device is deteriorated.

Further, when the information once written is rewritten, updated information is then written after the written information is erased, which is a disadvantage shared by the non-volatile semiconductor memory devices (flash memory) according to the both methods. In other words, Because the two steps of erasure and writing are required, an operation time is increased.

Further, in the case where two memories, which are a memory for storing programs and a memory for storing data such as a built-in micro-controller, are necessary, it has to prepare two memories which are differently configured depending on respective usages.

SUMMARY OF THE INVENTION

The present invention was invented in consideration of the foregoing conditions, and a main object of the present invention is to provide a non-volatile semiconductor memory device according to the two-transistor current differential detecting method capable of achieving a better area efficiency, and improvement of a rewriting efficiency is also taken into account.

A non-volatile semiconductor memory device according to the present invention comprises a memory cell array arranged in a matrix shape, a group of word lines, a group of bit lines and a differential detector, wherein memory cell array has a group of the memory cells which can retain two-bit information, and each of the memory cells has a pair of transistors having a charge storage region and disposed along a row direction of the memory cell array;

the word lines are provided between the memory cells adjacent to each other along a column direction of the memory cell array and extend along the row direction, the respective bit lines are provided between the transistors adjacent to each other along the row direction and extend along the column direction, gates of the pair of transistors constituting each of the memory cells are connected to each other and further connected to the word line corresponding to the relevant memory cell, sources of the pair of transistors are connected to each other and further connected to the bit lines provided between the relevant pair of transistors, drains of the transistors facing each other between the memory cells adjacent to each other along the row direction are connected to each other and further connected to the bit line provided between the relevant adjacent memory cells, a pair of the bit lines connected to the drains of the pair of transistors which all of the memory cells have are connected to a comparison input terminal of the differential detector, and an information retained in the memory cell is read based on a comparison result of current amounts inputted to the differential detector via the pair of bit lines obtained by the differential detector in a state where memory cell currents are simultaneously and independently supplied to the pair of transistors.

A memory cell array according to the present invention comprises a group of memory cells arranged in a matrix shape capable of retaining two-bit information, a group of word liens and a group of bit lines, wherein each of the memory cells has a pair of transistors having a charge storage region and disposed along a row direction of the memory cell array, the word lines are provided between the memory cells adjacent to each other along a column direction of the memory cell array and extend along the row direction, the respective bit lines are provided between the transistors adjacent to each other along the row direction of the memory cell array and extend along the column direction gates of the pairs of transistors constituting the respective memory cells are connected to each other so as to thereby constitute the word line corresponding to the relevant memory cell, sources of the pair of transistors are connected to each other so as to thereby constitute the bit line provided between the relevant pair of transistors, drains of the transistors facing each other between the memory cells adjacent to each other along the row direction are connected to each other so as to thereby constitute the bit line provided between the relevant adjacent memory cells, currents are outputted from the pair of bit lines constituted by the drains of the pair of transistors which all of the memory cells have as a comparison target, and an information retained in the memory cell is read based on a comparison result of current amounts outputted from the pair of bit lines as a comparison target for differential detection in a state where memory cell currents are simultaneously and independently supplied to the pair of transistors.

Thereby, the area efficiency is increased, and restrictions on a gate threshold voltage of the memory cell transistor can be alleviated.

The foregoing constitutions include the following preferable modes. More specifically, the pair of transistors respectively has the charge storage regions independent from each other in vicinity of the drain and vicinity of the source immediately below the gate. In this mode, a two-bit/cell transistor having two local charge storage regions on the source side and the drain side, a typical example of which is an MONOS transistor, is used. The present mode is applicable without any increase of the bit lines. As a result, a bit number can be increased, and the area efficiency can be further improved.

Further, there is a mode that length of wirings connecting the bit lines to the differential detector is equal to one another in the respective bit lines. Accordingly, a reading accuracy of the information can be more improved through the comparison of the current amounts.

There is a mode that a magnitude relation of the current amounts supplied to the pair of bit lines connected to the drains of the pair of transistors is reversed in order to change the gate threshold voltages in the pair of transistors so that the information retained in the memory cell is rewritten. Accordingly, it becomes unnecessary to erase the information before it is rewritten, which increases a processing speed.

There is a mode that the gate threshold voltage of the transistor having the lower gate threshold voltage is preferably increased so that the threshold voltage when the information is rewritten is changed. In this case, the gate threshold voltage in only the bit whose information is rewritten is changed.

Further, there is a embodiment that a current adder is inserted between the pair of bit lines and the differential detector. Thereby, a current difference of at least a certain level can be surely obtained by adding the current to the bit line in the side where the data is not written in verification after the data is written. Therefore, the data rewriting can be realized with a small change to the gate threshold voltage. A key factor of the present mode is as follows. The two memory cell transistors to be compared are adjacent to each other, and the a variation of characteristics of the transistors are remarkably small in comparison to that of the memory cell array, which reduces the change of the gate threshold voltage. Meanwhile, the gate threshold voltage of the actual memory cell transistor is changeable in a very large scope. Therefore, when a magnitude relation of the gate threshold voltages of the pair of transistors is reversed while the verifying function is used at the same time, the data writing only requires a minimum change of the gate threshold voltage, which increases acceptable number of times when the data can be repeatedly written without the erasure. In other words, it can increase a limit number of times for the writing. More specifically, operation number of times when the gate threshold voltage is increased when the data is written is memorized and compared to an upper limit of the writing operations so that the data can be written until the limit is reached. As a result, the number of the writing operations can be increased.

There is a mode that the memory cell array further comprises a sense amplifier, a reference current generator for supplying a reference current to the sense amplifier, and a switcher for switching to the differential detector and the sense amplifier as a destination of the output of the memory cell array. Accordingly, a mode in which the memory cell array is connected to the differential detector and a mode in which the memory cell array is connected to the sense amplifier can be arbitrarily selected depending on use conditions. Therefore, the memory cell array can be selectively used for program storage and data storage, for example, in a built-in microcontroller.

According to the present invention, the memory cell currents are simultaneously supplied to the selected bit line and the pair of transistors on the both sides of the bit line, and the difference of the generated two independent memory cell currents is handled as the data, so that the area efficiency is increased and the restrictions on the gate threshold voltage of the memory cell transistor can be alleviated.

Further, the sense amplifier, reference current generator and switcher are additionally provided so that the memory cell array can be used for the program storage and data storage, for example, in the built-in microcontroller.

The non-volatile semiconductor memory device according to the present invention is installed in a system LSI or the like, and effective as a non-volatile semiconductor memory device in which an integration level is increased and restrictions on a writing operation are alleviated. The non-volatile semiconductor memory device is particularly effective for the program storage, for example, in the built-in microcontroller, and is also applicable to a constitution in which a larger capacity is desirable as a general-purpose flash memory. Further, the non-volatile semiconductor memory device can be incorporated into a set device in which the program storage and the data storage can be selected whenever necessary.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 1 is a block circuit diagram illustrating a constitution of a non-volatile semiconductor memory device according to a preferred embodiment 1 of the present invention.

FIG. 2 is a table showing a relationship between voltages in a word line and a bit line necessary in a reading operation in the preferred embodiment 1.

FIG. 5 is a block circuit diagram illustrating a constitution of a non-volatile semiconductor memory device according to a preferred embodiment 3 of the present invention.

FIG. 6 is a schematic sectional view of a conventional memory cell according to a two-transistor current differential detecting method.

FIG. 7 is a schematic illustration of a conventional memory cell array according to a sense amplifier method.

DETAILED DESCRIPTION OF THE INVENTION

Figure 3:
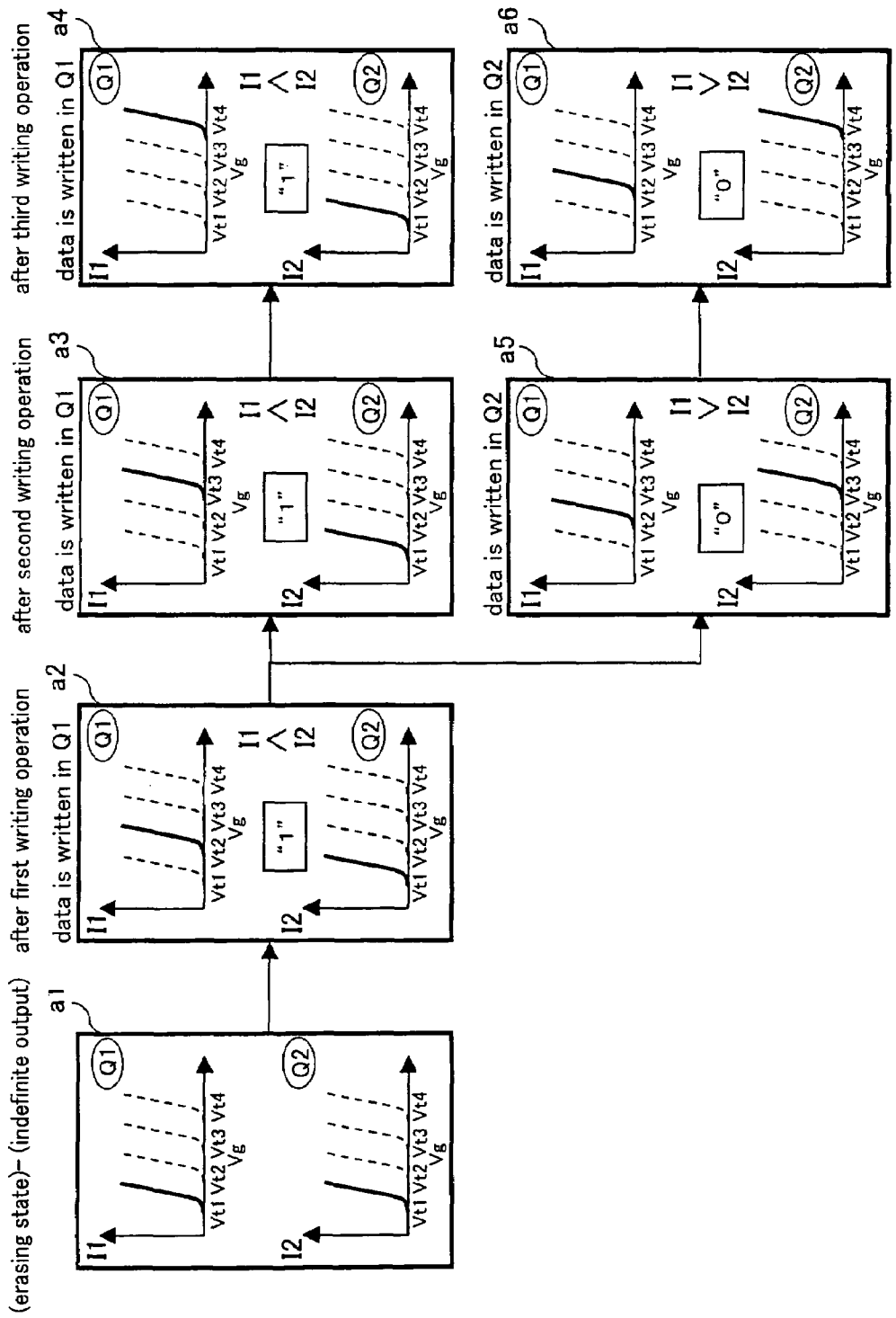
FIG. 3 is an illustration of an information rewriting operation according to preferred embodiment 1.

Hereinafter, preferred embodiments of a non-volatile semiconductor memory device according to the present invention are described in detail referring to the drawings.

Preferred Embodiment 1

FIG. 1 is a block circuit diagram illustrating a constitution of a non-volatile semiconductor memory device according to a preferred embodiment 1 of the present invention. In FIG. 1, a reference numeral 10 denotes a memory cell array in which a group of memory cells 11 are arranged in a matrix shape. In the respective memory cells 11, a pair of MOS (Metal Oxide Semiconductor) transistors Q1 and Q2 constitutes the memory cell 11. The transistors Q1 and Q2 are disposed in parallel along a row direction of the memory cell array 10.

Source of the pair of transistors Q1 and Q2 are connected to each other. C11 and C12 denote two charge storage regions of the transistor Q1, and C21 and C22 denote two charge storage regions of the transistor Q2. Accordingly, the respective transistors Q1 and Q2 can retain two-bit information. B1, B2, B3, B4 and B5 are bit lines of the memory cells 11, and the bit lines B1-B5 are provided between the adjacent transistors Q1, Q2, . . . along the row direction and extend along a column direction of the memory cell array 10. The bit lines B1 and B2 are electrically connected to a part corresponding to a drain or the source of the transistor Q1, and the bit lines B2 and B3 are electrically connected to a part corresponding to the source or a drain of the transistor Q2. This connection structure is more specifically described below.

The sources of the pair of transistors Q1 and Q2 are connected to each other, and further connected to the bit lines B2, B4, . . . provided between the pair of transistors Q1 and Q2. The drains of the transistor Q1 and the transistor Q2 facing each other between the adjacent memory cells 11 and 11 along the row direction are connected to each other, and further connected to the bit lines B1, B3, . . . provided between the adjacent memory cells 11 and 11.

W1, W2 and W3 denote word lines, and the word lines W1-W3 are provided between the adjacent memory cells 11 along the column direction of the memory cell array 10 and extend along the row direction. The word line W1 is connected to gates of the transistors Q1 and Q2 adjacent to each other and the transistors adjacently provided in the same row as the transistors Q1 and Q2. Further describing the connection structure in detail, the gates of the pair of transistors Q1 and Q2 constituting the respective memory cell 11 are connected to each other, and further connected to the word lines W1 W3 corresponding to the relevant memory cell 11.

All of the bit lines are connected to a 2-way decoder 12. The 2-way decoder 12 outputs two memory cell currents (Act and Ref). The memory cell currents outputted by the 2-way decoder 12 are characterized in that the bit lines (B1, B3) and (B3, B5) respectively connected to the drains of the transistors Q1 and Q2 constituting the same memory cell 11 are electrically insulated from each other, and the memory cell currents are outputted in such a manner that these currents supplied to the bit lines (B1, B3) and (B3, B5) are independent from each other. The 2-way decoder 12 outputs these two outputs to the differential detector 13.

Lengths of wirings for connecting the bit lines B1-b5 to the differential detector 13 are equal in the respective bit lines B1-B5. Thereby, a reading accuracy of the information can be more improved through comparison of amounts of the currents.

An operation of the non-volatile semiconductor memory device according to the present preferred embodiment thus constituted is described below.

Figure 2:
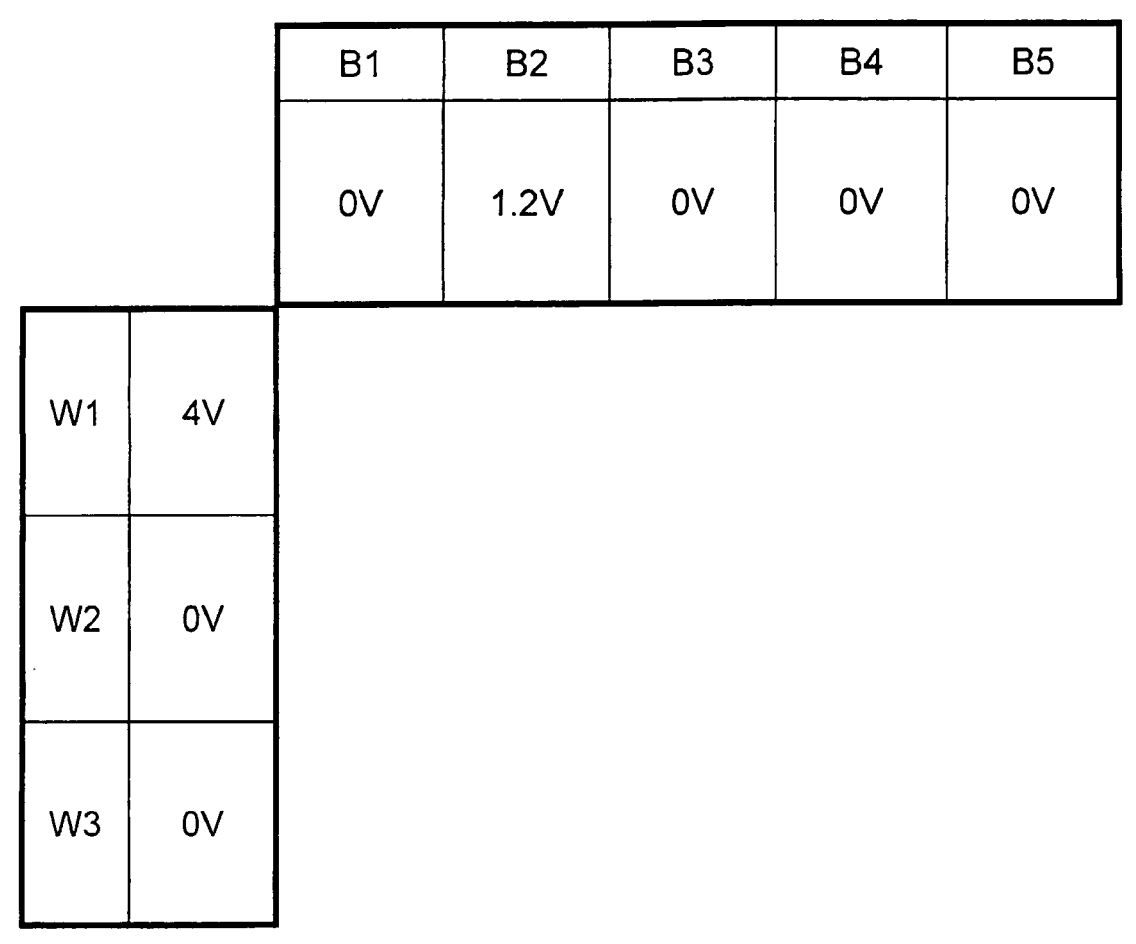

First, a reading operation is described. FIG. 2 shows a relationship between voltages in the word line and the bit line required for the reading operation. More specifically, FIG. 2 shows conditions when degrees of the charge storage states in the charge storage regions C11 and C22 of the transistors Q1 and Q2 are converted into electrical signals and read as recorded information. Referring to the bit lines, 1.2V is applied to the bit lines B2 and B4 (sources are commonly connected), while 0V is applied to the other bit lines B1, B3 and B5. Referring to the word lines, 4V is applied to the word line W1, while 0V is applied to the other word lines W2 and W3.

In this state, in FIG. 1, a potential difference is generated between either of the parts becoming the source and the drain, and the other respectively in the transistors Q1 and Q2 in the foregoing state. Further, voltages enough for memory cell currents I1 and I2 to be flown out of the transistors Q1 and Q2 are respectively applied to the gates thereof. As a result, the amounts of the currents respectively flowing in the transistors Q1 and Q2 correspond to the current amounts in accordance with the charge storage amounts in the charge storage regions C11 and C22. More specifically, the memory cell current I1 having the current amount corresponding to the charge storage amount in the transistor Q1 is supplied to the bit line B1 connected to the drain of the transistor Q1, while the memory cell current I2 having the current amount corresponding to the charge storage amount in the transistor Q2 is supplied to the bit line B3 connected to the drain of the transistor Q2 independently from the memory cell current I1. This is a technical advantage in the present invention. The charge storage regions C12 and C21, which overlaps with a depletion region when the voltages are applied to the bit lines, do not affect the current amounts of the transistors Q1 and Q2.

The memory cell currents I1 and I2 flowing on the bit lines B1 and B3 in the foregoing state are outputted as the two independent currents Act and Ref to the differential detector 13 via the 2-way decoder 12. The differential detector 13 judges which of the currents Act and Ref is larger than the other, and outputs in two-state in accordance with a result of the judgment. For example, data "1" is outputted when the memory cell current I1 is larger than the memory cell current I2, while data "0" is outputted otherwise.

In consequence of the foregoing process, the difference between the respective charge storage amounts in the two charge storage regions in the pair of transistors is outputted as the information, and the function of the non-volatile semiconductor memory is thereby exerted.

In the foregoing description, the method of reading the information in the respective charge storage regions C11 and C22 of the transistors Q1 and Q2 was described. When information at any other address is read, it is better that the charge storage regions having a positional relationship relative to the charge storage regions C11 and C22 are impressed by selecting the voltages of the word line and the bit line having the relative positional relationship.

FIG. 3 is an illustration of an information rewriting operation in the non-volatile semiconductor memory device according to the preferred embodiment 1. As is clear from FIG. 3, the gate threshold voltage of the transistor is low when the amount of stored charges is small, and the gate threshold voltage of the memory cell 11 is increased as the amount of stored charges is increased.

First, the charge storage amounts in the transistors Q1 and Q2 are respectively reduced to a minimum level, which corresponds to data erasure in a conventional flash memory. At the time, the gate threshold voltages of the transistors Q1 and Q2 are both Vt1 which is a base level, and an I-V characteristic thereof is denoted by a1. The memory cell current I1 flowing in the transistor Q1 and the memory cell current I2 flowing in the transistor Q2 at the time are substantially equal to each other. Therefore, the reading operation is not possible, which makes the output indefinite.

The first writing operation is executed in the state where the I-V characteristic is a1. The I-V characteristic is denoted by a2 when the writing operation is executed by increasing the charge storage amount of the transistor Q1. When the information is read at the time, as the memory cell current I1 is smaller than the memory cell current I2, the magnitude relation can be expressed as the output (data "1").

The information can be rewritten in the state where the I-V characteristic is a2 without the so-called erasing operation in the conventional flash memory. When the charge storage amount of the transistor Q1 is increased in the state where the I-V characteristic is a2, the I-V characteristic is denoted by a3. The memory cell current I1 is further reduced through the foregoing writing operation, however, the reading operation shows the same result (data "1").

On one hand, when the charge storage amount of the transistor Q2 is increased, the I-V characteristic is denotes by a 5.

At the time, the gate threshold voltage of the transistor Q2 is higher than that of the transistor Q1. Thus, the magnitude relation of the memory cell currents I1 and I2 are contrary to that of the I-V characteristic a2, which means that the data has been rewritten (data "0"). As described, the data can be rewritten when the charge amount in the charge storage region where the data is desirably written in the rewriting operation is increased.

The gate threshold voltage was conventionally increased with respect to the entire memory cell array 10 in the case where the rewriting operation showed the same result. In contrast, the charge storage amount only in the region where the data is desirably rewritten can be selectively increased in the present preferred embodiment.

Preferred Embodiment 2

Figure 4:
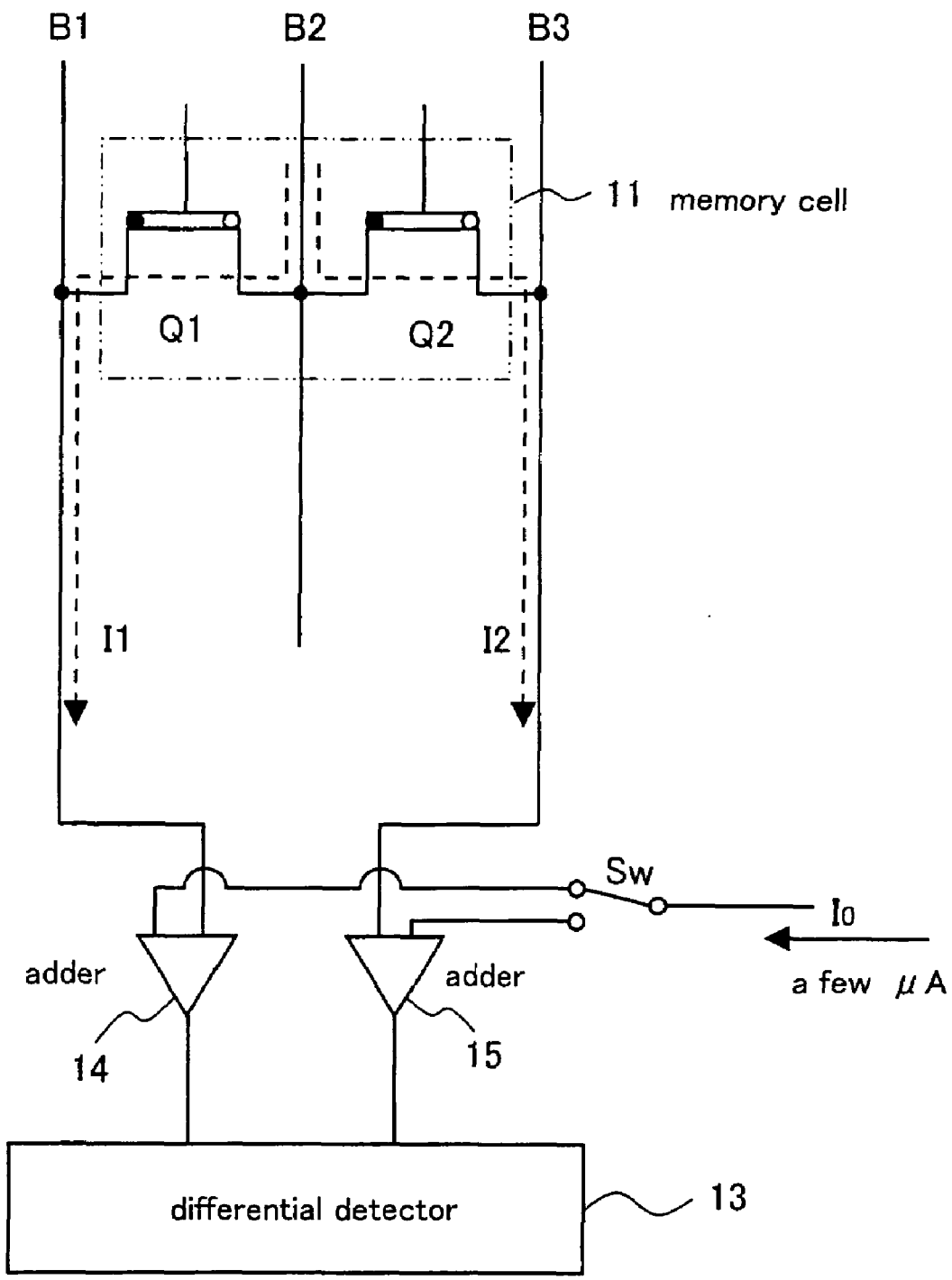
FIG. 4 shows a schematic constitution of a non-volatile semiconductor memory device according to a preferred embodiment 2 of the present invention.

FIG. 4 shows a schematic constitution of a non-volatile semiconductor memory device according to a preferred embodiment 2 of the present invention. A constitution of the memory cell array 10 according to the present preferred embodiment is the same as that of the preferred embodiment shown in FIG. 1. In the present preferred embodiment, adders 14 and 15 are inserted on the input side of the differential detector 13 at intermediate positions of the pair of bit lines B1 and B3 as a comparison target separately from the constitution shown in FIG. 1. A constant current $I_0$ with a few µA is added to only either of the input sides of the adders 14 and 15 via a switch S2.

According to the foregoing constitution, a difference of at least a few µA can be surely obtained between the memory cell currents I1 and I2 in the verification. As a result, an upper limit of the number of times for the writing operations can be effectively increased. In FIG. 4, the 2-way decoder 12 is not shown in the figure.

Preferred Embodiment 3

FIG. 5 is a block circuit diagram illustrating a constitution of a non-volatile semiconductor memory device according to a preferred embodiment 3 of the present invention. A part of the memory cell array 10 according to the present preferred embodiment is the same as that of the preferred embodiment shown in FIG. 1. In the present preferred embodiment, a sense amplifier 16, a reference current generator 17 and a switcher 18 for switching to each other a state where the memory cell array 10 is connected to the differential detector 13 and a state where the memory cell array 10 is connected to the sense amplifier 16 separately from the constitution shown in FIG. 1. The switcher 18 comprises three switches S1, S2 and S3. The switches S1 and S2 are interfaced to each other. The 2-way decoder 12 is not shown in FIG. 5. As the description of the reading operation, it is assumed that the memory cell array 10 is in the same status as described in the preferred embodiment 1.

In the case where the differential detector 13 is used to read the information in a manner similar to the preferred embodiment 1, the switches S1 and S2 are switched to the differential-detector-13 side in the switcher 18. The memory cell current I1 flowing from the transistor Q1 via the bit line is inputted to the differential detector 13 via the switch S1. Furthermore, the memory cell current I2 flowing from the transistor Q2 via the bit line is inputted to the differential detector 13 via the switch S2.

In the case where the information is read via the sense amplifier 16, the switches S1 and S2 are switched to the sense-amplifier-16 side in the switcher 18. Then, the switch S3 is connected to the switch-S1 side so that the memory cell current I1 is supplied to the sense amplifier 16, and a reference current I3 from the reference current generator 17 is compared to the memory cell current I1 in the sense amplifier 16. Further, the switch S3 is switched to the switch-S2 side so that the memory cell current I2 is supplied to the sense amplifier 16, and the reference current I3 is compared to the memory cell current I2 in the sense amplifier 16. Then, the read information is discriminated.

In place of the reference current generator 17, a constant voltage source may be used.

Though the preferred embodiments of this invention are explained in detail, it will be understood that various modifications may be made therein, and it is intended to cover in the appended claims all such modifications as fall within the true spirit and scope of this invention.

What is claimed is:

1. A non-volatile semiconductor memory device comprising:
    a memory cell array in which a group of memory cells are arranged in a matrix shape;
    a group of word lines;
    a group of bit lines; and
    a differential detector, wherein
    the group of memory cells can retain two-bit information, and each of the memory cells has a pair of transistors having a charge storage region and arranged along a row direction of the memory cell array;
    the word lines are provided between the memory cells adjacent to each other along a column direction of the memory cell array and extend along the row direction,
    the respective bit lines are provided between the transistors adjacent to each other along the row direction and extend along the column direction,
    gates of the pair of transistors constituting the respective memory cells are connected to each other and further connected to the word line corresponding to the relevant memory cell,
    sources of the pair of transistors are connected to each other and further connected to the bit lines provided between the relevant pair of transistors,
    drains of the transistors facing each other between the memory cells adjacent to each other along the row direction are connected to each other and further connected to the bit line provided between the relevant adjacent memory cells,
    a pair of the bit lines connected to the both drains of the pair of transistors included in all of the memory cells are connected to a comparison input terminal of the differential detector, and
    an information retained in the memory cell is read based on a comparison result of current amounts inputted to the differential detector via the pair of bit lines obtained by the differential detector in a state where memory cell currents are simultaneously and independently supplied to the pair of transistors.

2. The non-volatile semiconductor memory device according to claim 1, wherein
    the pair of transistors respectively has charge storage regions independent from each other in vicinity of the drain and vicinity of the source immediately below the gate.

3. The non-volatile semiconductor memory device according to claim 1, wherein
    length of wirings connecting the bit lines to the differential detector are equal to one another in the respective bit lines.

4. The non-volatile semiconductor memory device according to claim 1, wherein
a magnitude relation of the current amounts supplied to the pair of bit lines connected to the both drains in the pair of transistors are reversed in order to change the gate threshold voltages in the pair of transistors so that the information retained in the memory cell is rewritten.

5. The non-volatile semiconductor memory device according to claim 4, wherein
the gate threshold voltage of the transistor having the lower gate threshold voltage is increased so that the threshold voltage is changed when the information is rewritten.

6. The non-volatile semiconductor memory device according to claim 1, wherein
a current adder is inserted between the pair of bit lines and the differential detector.

7. The non-volatile semiconductor memory device according to claim 1, further comprising:
a sense amplifier;
a reference current generator for supplying a reference current to the sense amplifier; and
a switcher for switching the differential detector and the sense amplifier to each other as a destination of the output of the memory cell array.

8. A memory cell array comprising:
a group of memory cells arranged in a matrix shape and capable of retaining two-bit information;
a group of word lines; and
a group of bit lines, wherein
each of the memory cells has a pair of transistors having a charge storage region and arranged along a row direction of the memory cell array,
the word lines are provided between the memory cells adjacent to each other along a column direction of the memory cell array and extend along the row direction,
the respective bit lines are provided between the transistors adjacent to each other along the row direction of the memory cell array and extend along the column direction
gates of the pair of transistors constituting the respective memory cells are connected to each other, which thereby constitute the word line corresponding to the relevant memory cell,
sources of the pair of transistors are connected to each other, which thereby constitute the bit line provided between the relevant pair of transistors,
drains of the transistors facing each other between the memory cells adjacent to each other along the row direction are connected to each other, which thereby constitute the bit line provided between the relevant adjacent memory cells,
currents are outputted from the pair of bit lines constituted with the both drains in the pair of transistors included in all of the memory cells as a comparison target for differential detection, and
an information retained in the memory cell is read based on a comparison result of current amounts outputted from the pair of bit lines as a comparison target for differential detection in a state where memory cell currents are simultaneously and independently supplied to the pair of transistors.

9. The memory cell array according to claim 8, wherein
the pair of transistors respectively has charge storage regions independent from each other in vicinity of the drain and vicinity of the source immediately below the gate.

10. The memory cell array according to claim 8, wherein
a magnitude relation of the current amounts supplied to the pair of bit lines connected to the both drains of the pair of transistors are reversed in order to change the gate threshold voltages in the pair of transistors so that the information retained in the memory cell is rewritten.

11. The memory cell array according to claim 8, wherein
the gate threshold voltage of the transistor having the lower gate threshold voltage is increased so that the threshold voltage is changed when the information is rewritten.

* * * * *